United States Patent [19]

Poppert et al.

[11] Patent Number: 4,631,806
[45] Date of Patent: Dec. 30, 1986

[54] METHOD OF PRODUCING INTEGRATED CIRCUIT STRUCTURES

[75] Inventors: Paul E. Poppert, Acton; Marvin J. Tabasky, Peabody; Eugene O. Degenkolb, Wayland, all of Mass.

[73] Assignee: GTE Laboratories Incorporated, Waltham, Mass.

[21] Appl. No.: 736,881

[22] Filed: May 22, 1985

[51] Int. Cl.⁴ .................. H01L 21/28; H01L 21/312; H01L 21/88

[52] U.S. Cl. ....................... 29/589; 29/578; 29/577 C; 29/591; 148/DIG. 20; 148/DIG. 100; 148/DIG. 106; 427/89; 156/659.1; 156/644

[58] Field of Search ............. 29/578, 577 C, 589, 29/590, 591; 148/DIG. 106, DIG. 122, DIG. 20, DIG. 100; 427/88, 89, 90, 91; 156/643, 644, 652, 659.1

[56] References Cited

U.S. PATENT DOCUMENTS

| | | | |
|---|---|---|---|
| 3,945,347 | 3/1976 | Takemoto et al. | 29/591 X |
| 4,174,562 | 11/1979 | Sanders et al. | 29/591 X |
| 4,328,262 | 5/1982 | Kurahashi et al. | 427/90 X |
| 4,367,119 | 1/1983 | Logan et al. | 156/643 |
| 4,392,298 | 7/1983 | Barker et al. | 29/591 X |
| 4,518,629 | 5/1985 | Jeuch | 427/89 |
| 4,519,872 | 5/1985 | Anderson et al. | 29/591 X |
| 4,532,002 | 7/1985 | White | 156/652 X |

FOREIGN PATENT DOCUMENTS 0028868  3/1977  Japan ................................ 29/591

OTHER PUBLICATIONS

Agnihotri et al "Single Photoresist for Polyimide-Insulator Via" IBM Tech. Disc. Bull. vol. 22, No. 5, Oct. 1979, pp. 1821-1822.

Primary Examiner—Brian E. Hearn
Assistant Examiner—David A. Hey
Attorney, Agent, or Firm—David M. Keay

[57] ABSTRACT

Method of producing two-layer metal interconnections in a semiconductor integrated circuit structure coated with silicon dioxide. Masking material is deposited on the silicon dioxide. Openings are formed in the masking material and then in the silicon dioxide to expose contact areas on the integrated circuit structure. A first metal, tungsten, is deposited on the masking material and on the contact areas exposed at the openings. The masking material and the overlying tungsten are stripped off leaving tungsten only on the contact areas. A second metal, aluminum, is deposited over the silicon dioxide and the tungsten on the contact areas. Aluminum is selectively removed to form a pattern of conductive members of tungsten-aluminum on the contact areas and of aluminum over the silicon dioxide.

5 Claims, 8 Drawing Figures

METHOD OF PRODUCING INTEGRATED CIRCUIT STRUCTURES

BACKGROUND OF THE INVENTION

This invention relates to semiconductor integrated circuit structures. More particularly, it is concerned with methods of fabricating electrical interconnections between elements of semiconductor integrated circuits.

In semiconductor integrated circuits it is frequently necessary to use two layers of conductive material in the electrical interconnections between elements because no single conductive material has ideal properties. Typically a layer of a first metal provides a thin diffusion barrier which prevents alloying between the semiconductor material and an upper layer of a second metal. Aluminum has been found particularly useful as a conductive material for interconnections on semiconductor integrated circuits. In order to prevent the aluminum from alloying with the semiconductor material and possibly causing short-circuits through shallow junctions, an underlaying layer of a diffusion barrier material, for example tungsten, is provided between the semiconductor material and the aluminum. Fabricating electrical interconnections of two layers of metal is more complex since the metal etching process must be carried out in two steps rather than one.

Difficulty is frequently encountered in precisely defining elements of an integrated circuit structure when the surface of the structure is irregular by virtue of the presence of several layers of different materials disposed on various portions of the semiconductor body. In order to correct for the unevenness of the surface, particularly when employing photographic techniques to define elements, planarizing material is placed over the structure in order to provide a more nearly planar upper surface. The layer of planarizing material is covered with a thin sputtered layer of silicon, and a conventional photoresist material is applied over the silicon layer. Standard photolithographic techniques are employed to form openings in the photoresist material, and the sputtered silicon layer is etched to produce openings therein, defined by the openings in the photoresist material. The silicon layer then serves as a mask for etching openings in the planarizing material and in the underlying integrated circuit structure. This procedure is known as the tri-level resist technique and is widely used in the semiconductor industry.

In fabricating electrical interconnections of two layers of metal on an integrated circuit structure, the tri-level resist technique is employed to form openings in the adherent protective coating to expose contact areas. The masking materials are removed. The first and then the second metal of the two-layer interconnections are deposited over the structure. The tri-level resist technique is repeated to define the desired pattern of electrical connections by exposing the metal which is to be removed. The unwanted upper metal is removed and then the exposed unwanted lower metal is removed in a two-step etching process leaving the desired pattern of interconnections.

SUMMARY OF THE INVENTION

The method in accordance with the present invention for producing interconnections in an integrated circuit structure comprises providing an integrated circuit structure having a surface coated with a layer of an adherent nonconductive protective material. Masking material is deposited on the layer of protective material, and openings are formed in the masking material and in the layer of protective material to expose contact areas on the surface of the integrated circuit structure. A first conductive material is deposited overlying the remainder of the masking material and the contact areas which are exposed at the openings in the masking material and in the protective material. The remainder of the masking material is then removed together with the first conductive material thereon, leaving first conductive material on the contact areas. A second conductive material is deposited over the protective material and over the first conductive material on the contact areas. Portions of the second conductive material are selectively removed to form conductive members which overlie the first conductive material on the contact areas and overlie portions of the layer of protective material.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following disclosure and appended claims in connection with the above described drawings.

DETAILED DESCRIPTION OF THE INVENTION

Monolithic semiconductor integrated circuit structures are fabricated on a wafer or slice of single crystal semiconductor material. As is well-understood the slice or wafer is usually of relatively large surface area upon which many identical circuit networks each including many devices are fabricated simultaneously. However, for purposes of illustration a fragment of a slice of semiconductor material is shown and described herein. In the following description silicon is employed as the semiconductor material.

Figure 1:
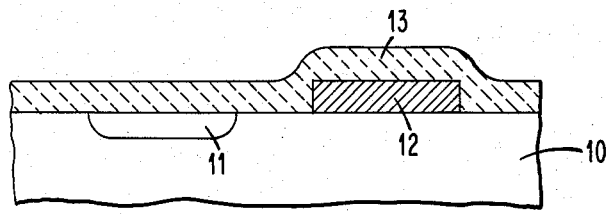
FIGS. 1-8 are a series of elevational views in cross-section of a fragment of a wafer of semiconductor material illustrating the fragment at various stages during the fabrication of conductive interconnections therein in accordance with the present invention.

FIG. 1 illustrates a fragment 10 of a body of single crystal silicon of one conductivity type. For illustrative purposes a region 11 of the opposite conductivity type is shown inset in the fragment 10. Also for illustrative purposes an element 12 which rises above the flat, planar surface of the wafer is shown. The element 12 has a conductive upper surface and may be of metal or of polycrystalline silicon, and may be in ohmic contact, rectifying contact, or insulated from the underlying silicon of the slice 10. The surface of the structure is covered with an adherent protective coating 13 of non-conductive material. As is well-known in the art the protective material of the layer 13 may be silicon dioxide, silicon nitride, or silicon dioxide and silicon nitride. For purposes of illustrating the method of the invention an electrical connection is to be provided between the region 11 and the element 12.

Figure 2:
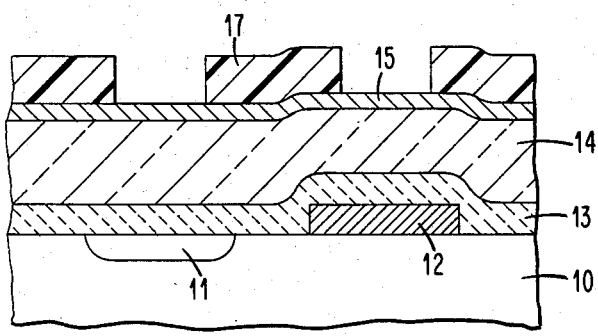

As illustrated in FIG. 2 the layer of protective material 13, for example silicon dioxide, is covered with a layer 14 of a planarizing material to smooth out the irregular surface of the structure. The planarizing material may be any of various known materials used for this purpose, for example polyimide. The planarizing material 14 may be applied as by spinning. The layer of planarizing material 14 is coated with a layer of silicon 15 to provide a suitable etch resistant material to protect the planarizing material. A photoresist material 17 is then applied to the surface of the silicon layer 15.

Figure 3:
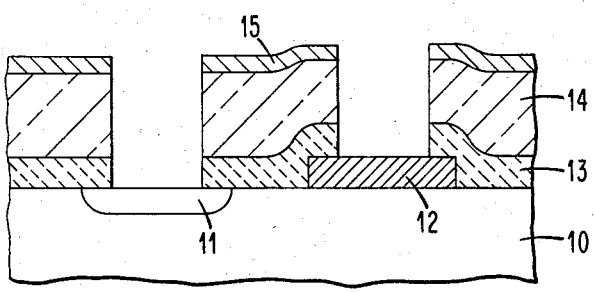

By employing known photolithographic techniques portions of the photoresist material 17 are removed to provide a layer of photoresist material having openings overlying the desired contact areas of the region 11 and the element 12 of the integrated circuit structure as illustrated in FIG. 2. The assembly is then subjected to etching in a suitable reactive ion etching apparatus. The photoresist material 17 protects the underlying silicon layer permitting the openings to be formed in the silicon layer as illustrated in FIG. 3. Etching is continued using a plasma which preferentially attacks the planarizing material 14 but has insignificant effect on the silicon layer 15. Openings are thus formed in the planarizing material 14 exposing underlying silicon dioxide 13. During this procedure the overlying photoresist material 17 is also removed. Etching is continued employing a suitable plasma to etch through the exposed silicon dioxide of the layer 13. As illustrated in FIG. 3 the surfaces of the region 11 and the element 12 which are to be the contact areas are exposed. It is desirable that etching of the planarizing material 14 be continued for sufficient time to provide some undercutting of the planarizing material 14 over the silicon dioxide layer 13.

Figure 4:
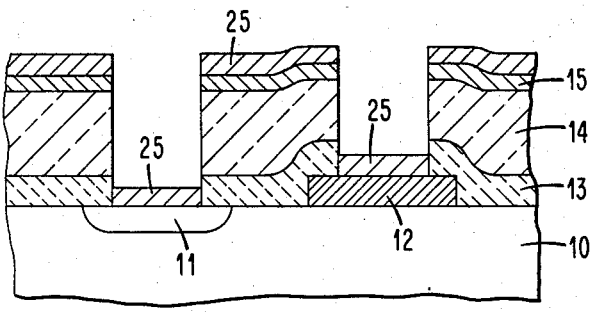
Figure 5:
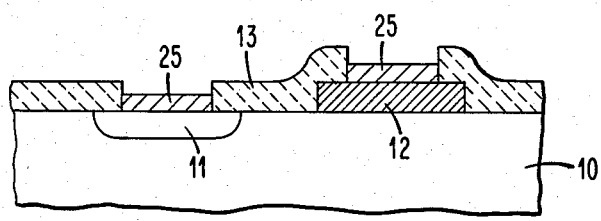

Next, as illustrated in FIG. 4 a first metal 25, for example tungsten, is applied to the exposed surfaces of the assembly as by sputtering or photochemical vapor deposition. The first metal 25 overlies the silicon layer 15 of the masking material and also is deposited in the openings in the masking material on the contact areas of the region 11 and the element 12. The masking material of the planarizing material 14 and the silicon 15 together with the overlying first metal 25 are stripped from the assembly by etching the assembly in a solvent which dissolves the planarizing material. Preferably the assembly is immersed in a solvent while being agitated ultrasonically to enable rapid undercutting of the layer of planarizing material 14 thereby facilitating complete separation of the planarizing material 14 and the overlying material from the structure. The resulting assembly is illustrated in FIG. 5. The contact areas to the region 11 and the element 12 as defined by the openings in the silicon dioxide layer 13 are completely covered by the first metal 25. The contact areas and the areas of metallization are both defined by the same masking arrangement without any intervening processing steps. Depending upon the particular materials and processes being employed, the assembly may then be annealed to form a silicide of the first metal 25 at the interface of the metal and silicon.

Figure 6:
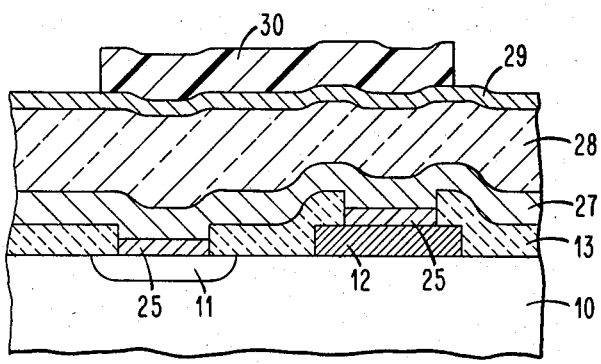

The assembly is then coated with a layer 27 of a second metal, specifically aluminum, as illustrated in FIG. 6. The aluminum layer is covered with a layer of a planarizing material 28, a layer of silicon 29, and a layer of photoresist material 30 in accordance with the tri-level resist technique described previously. Again, by employing conventional photolithographic techniques the photoresist material 30 is selectively removed to leave resist material in the desired pattern of conductive members for electrically interconnecting the elements of the structure.

Figure 7:
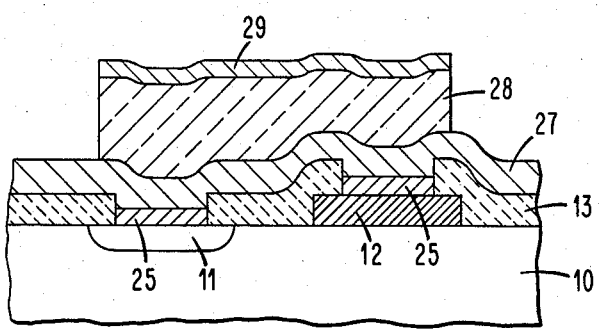
Figure 8:
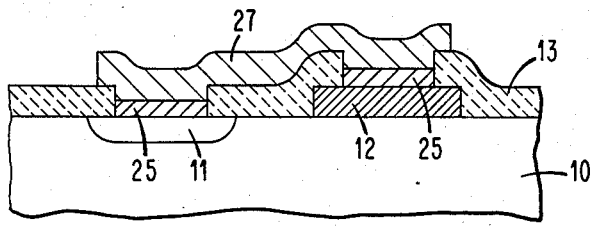

In generally the same manner as previously described the assembly is subjected to reactive ion etching employing suitable etching plasmas to form a mask of the planarizing material 28 and silicon 29 in the same configuration as the pattern of the photoresist material 30. During this procedure the photoresist material 30 is removed. As illustrated in FIG. 7 the aluminum layer 27 is exposed except for the portions covered by the masking materials 28, 29 in the pattern of the desired contact members. The assembly is treated in a suitable etching plasma to remove the exposed aluminum. The masking materials 28, 29 are then removed as by agitating in a suitable solvent or by oxygen plasma. The resulting structure is illustrated in FIG. 8. The interconnect member is of aluminum 27 with diffusion barrier metal 25 between the aluminum 27 and the contact areas of the region 11 and the element 12.

In a specific embodiment in accordance with the present invention the semiconductor material of the body 10, as indicated previously, is silicon. The protective material of the adherent coating 13 is silicon dioxide of 3000 to 10000 angstroms thick. The planarizing material 14 is a layer of polyimide of about 2 to 2½ micrometers thick. The sputtered silicon layer 15 is approximately 1000 angstroms thick and the photoresist layer is of the order of 5000 angstroms thick. The diffusion barrier metal 25 is a layer of tungsten approximately 2000 angstroms thick. The aluminum 27 is from 7000 to 9000 angstroms thick.

In fabricating two-layer metal contacts in accordance with the method of the present invention the contact areas once exposed are not subjected to further processing steps. Since the contact areas are immediately coated with the first metal before removal of the masking materials, exposure to possible contaminating materials is minimized. The first metal is automatically aligned with the contact areas because the same masking arrangement is used to define the openings in the protective material and the metallization of the contact areas. Since the contact areas are thus completely covered by the first metal, slight misalignment of the masking arrangement defining the aluminum of the contact members will not cause any portion of the contact areas to be exposed with possible deleterious effects. In addition, since the first metal lies only on the contact areas where it is needed and not under the remainder of the interconnect members, there is some smoothing out of the topography of the final surface of the assembly.

While there has been shown and described what is considered a preferred embodiment of the present invention, it will be obvious to those skilled in the art that various changes and modifications may be made therein without departing from the invention as defined by the appended claims.

What is claimed is:

1. The method of producing interconnections in an integrated circuit structure comprising
    providing an integrated circuit sturcture including a body of silicon and having a surface coated with a layer of an adherent nonconductive protective material of silicon dioxide, silicon nitride, or silicon dioxide and silicon nitride;
    depositing masking material on the layer of protective material including the steps of depositing a layer of a planarizing material on said layer of protective material, and depositing a layer of silicon on said layer of planarizing material;

forming openings in said masking material and in said layer of protective material to expose contact areas on said surface of the integrated circuit structure;

depositing a first conductive material overlying the remainder of the masking material and the contact areas exposed at the openings in the masking material and in the protective material;

removing the remainder of the masking material and the first conductive material thereon leaving first conductive material on said contact areas;

depositing a second conductive material overlying said protective material and the first conductive material on said contact areas; and selectively removing portions of said second conductive material to form conductive members overlying the first conductive material on said contact areas and overlying portions of said layer of protective material;

wherein said first conductive material is a metal which provides a barrier to diffusion of the second conductive material therethrough.

2. The method in accordance with claim 1 wherein forming openings in said masking material includes depositing a layer of a resist material on said layer of silicon, forming openings in the resist material to define the pattern of contact areas, etching to remove the silicon exposed by the openings in the resist material and to form openings in the layer of silicon, etching to remove the planarizing material exposed by the openings in the layer of silicon to form openings in the layer of planarizing material, and etching to remove the nonconductive protective material exposed by the openings in the layer of planarizing material and to expose said contact areas on the surface of the integrated circuit structure.

3. The method in accordance with claim 2 wherein said second conductive material is aluminum.

4. The method in accordance with claim 3 wherein selectively removing portions of said second conductive material includes depositing masking material on the second conductive material including the steps of depositing a layer of a planarizing material on the second conductive material, and depositing a layer of silicon on the layer of planarizing material;

selectively removing portions of said masking material overlying said portions of said second conductive material to be removed; and etching to remove the exposed portions of said second conductive material leaving said conductive members.

5. The method in accordance with claim 4 wherein removing the remainder of the masking material and the first conductive material thereon includes agitating the integrated circuit structure while it is immersed in a solvent capable of dissolving the planarizing material.

* * * * *